United States Patent [19]

Baird et al.

[11] Patent Number: 4,487,999

[45] Date of Patent: Dec. 11, 1984

[54] MICROWAVE CHIP CARRIER

[75] Inventors: Phillips C. Baird, Lakeville; Jay S. Greenspan, South Dartmouth, both of Mass.

[73] Assignee: Isotronics, Inc., New Bedford, Mass.

[21] Appl. No.: 457,112

[22] Filed: Jan. 10, 1983

[51] Int. Cl.³ .............................................. H05K 5/04
[52] U.S. Cl. ..................................... 174/52 S; 29/828; 333/246; 339/177 R
[58] Field of Search ............... 174/52 R, 52 S, 52 FP; 333/246, 238, 260, 21 R; 29/828, 879, 885; 339/17 R, 177 R

[56] References Cited

U.S. PATENT DOCUMENTS 3,480,887 11/1969 Uhlir, Jr. ..................... 174/52 R X
3,686,624 8/1972 Napoli et al. ..................... 333/260 X Primary Examiner—John Gonzales
Assistant Examiner—D. A. Tone
Attorney, Agent, or Firm—Weingarten, Schurgin, Gagnebin & Hayes

[57] ABSTRACT

An all-metal microwave chip carrier is provided with subminiature ceramic feedthroughs, each configured to function as a coaxial cable having a predetermined impedance. In one embodiment, the feedthroughs are formed by providing ceramic tubing metallized inside and out in which the ends are cut away to provide half-cylindrical bonding pads. In order to permit bonding directly to the feedthrough, a flat wire lead is soldered to the channel in the ceramic tube, with the ends of the flat wire extending onto the flat portions of the half-cylindrical portions of the feedthrough. In one embodiment, the chip carrier includes a base, ring, and stepped lid, all of Kovar or other suitable material, with the lid being weldable to the ring rather than being brazed or soldered.

20 Claims, 8 Drawing Figures ved. Standard chip carriers are hermetically sealed in such a manner that once sealed, the package must be destroyed in order to gain access to the components housed in the package. In contradistinction, welded packages have the advantage that the welded lid can be removed by grinding the weld off to permit access to the component, with the lid then being rewelded after repair.
MICROWAVE CHIP CARRIER

FIELD OF INVENTION

This invention relates to microwave chip carriers, and more particularly to a chip carrier having subminiature ceramic feedthroughs.

BACKGROUND OF THE INVENTION

Standard chip carriers are nonmetal in construction and are made chiefly of either glass or ceramic. To adapt a standard ceramic chip carrier for microwave applications, most of the entire outside surface would have to be metallized for shielding purposes and closure would have to be effected by solder sealing of the cover or lid. This closure method can result in solder being pressed into the inside of the package, or balls of solder may be formed during the soldering process, with the solder balls being free floating inside the package.

Moreover, the impedance of these standard chip carriers can only be controlled by the thickness of ceramic or glass between the layers of metallization and typically no shielding is provided between leads. Thus standard chip carriers in their present form cannot be used to house microwave devices.

It is nonetheless desirable to be able to modify standard glass or ceramic chip carriers so that these standard chip carriers can be used at microwave frequencies. More specifically, it would also be of definite advantage to be able to weld a cover onto these packages for reasons of repairability and hermeticity. Standard chip carriers are hermetically sealed in such a manner that once sealed, the package must be destroyed in order to gain access to the components housed in the package. In contradistinction, welded packages have the advantage that the welded lid can be removed by grinding the weld off to permit access to the component, with the lid then being rewelded after repair.

Microwave devices are presently housed in modules which are either routed out to provide a cavity for the device, or the housing is made up of metal parts which are brazed or soldered together. While Kovar is presently used for microwave modules, the lids of these devices are brazed or soldered, as opposed to welded, primarily because of the use of relatively large-diameter glass feedthroughs. These glass feedthroughs are on the order of 80 mils in diameter which results in an overall minimum package height of 110 mils, since the use of the glass feedthroughs requires 15 mils of sidewall material to either side. As used herein, mils refers to thousandths of an inch. In order to make these packages weldable, the frame height would have to be on the order of 135 mils. This means that 55 mils are added for accommodating the welding process. When a 20-mil base is added with a 5-mil cover, the resulting overall package height is on the order of 160 mils. This height is excessive and would preclude the use of such a weldable all-metal package in most if not all applications.

SUMMARY OF THE INVENTION

In the subject invention, in order to obviate the need for metallization of a standard chip carrier and to permit manufacture of a microwave device chip carrier which permits ready welding of a cover to a standard-thickness chip carrier ring, an all-metal microwave chip carrier is provided with subminiature feedthroughs which function as coaxial cable segments. The carrier includes a base, an intermediate ring in which the microwave component is mounted, and a stepped lid or cover, with the lid and ring being welded together to provide a hermetic seal. The intermediate ring is apertured at its base to provide cylindrical orifices into which are mounted the subminiature feedthroughs which are made of ceramic material. In one embodiment, the feedthroughs have flat stepped portions at either end to expose the central conductor of the coaxial feedthrough. In one embodiment these stepped portions are in the form of half cylinders with the top flat stepped portion lying in a horizontal plane passing through the centerline for the feedthrough. The contact pads are provided by the exposed ends of flat wire leads passing through the centers of the ceramic tubes. The tubes are metallized inside and out, and the flat wire lead is passed through the metallized interior channel. Alternatively a round wire may be used.

If a flat wire is used, the wire is soldered into place by the introduction of solder or other electrically conductive material between the wire and the metallized interior wall of the ceramic tube. Alternatively no additional electrically conductive material need be used if the edges of the flat wire contact the interior metallization of the tube. With an appropriate geometric configuration, the portion of the feedthrough passing through the wall of the ring is in the form of a coaxial cable having a predetermined impedance, in one embodiment 50 ohms. It will be appreciated that the flat wire provides a contact pad at either end which permits the mounting of the microwave device well down within the chip carrier ring. Additionally the interior contact pad may be bonded directly to a contact pad on the substrate of the microwave device in a so-called flip-chip configuration in which the microwave device is turned upside down so that the contact pads on the microwave device substrate directly contact and are bonded to the flat contact pads of the feedthrough. The pads outside the ring provide external connection to this device at the portion of the flat wire lead which extends from the exterior wall of the chip carrier ring. In the usual embodiment, the chip carrier is rectangular. In one embodiment, each cylindrical bore provided for a feedthrough is open to and exposed at the bottom edge of the chip carrier ring, such that when the base is mouned to the chip carrier ring the exterior of the feedthrough is in mechanical contact with the base. Thus mounting of the base to the ring provides electrical connection not only between the ring and the base, but also between the base and the exterior metallized surfaces of the feedthroughs. The result is that the base plate functions as an extremely effective groundplane.

As pointed out hereinbefore, previous ceramic chip carriers were metallized and were covered using a lid which was soldered or brazed into place. In the subject chip carrier, the lid is welded around the periphery as opposed to being soldered, due to the compatibility of the lid and ring materials, and also because subminiature feedthroughs permit welding while still providing a small enough package. In one embodiment all carrier components are made of Kovar, while in another embodiment the base is made of molybdenum. Kovar is an iron-nickel-cobalt alloy. Since the subject chip carrier permits welding, repair in the field may be accomplished simply by grinding off the weld, repairing the microwave device, and rewelding the lid.

More specifically, the subminiature size of the ceramic feedthroughs, being on the order of 50 mils as opposed to 80 mils, reduces the package size vis-a-vis that required by the standard glass seal feedthroughs and permits standard size chip carriers to be made. Additionally, the usable interior space in the chip carrier ring is increased by lowering the entry point of the internal lead. This in turn allows the microwave component to be mounted lower down in a standard-size carrier and permits the cover to easily fit down on the carrier ring without pressing against the microwave component. Moreover, the lower bonding pad permits the use of thinner microwave device substrates. In one embodiment, the overall height of the sealed package is 115 mils. This is about the same height as a conventional brazed Kovar microwave module which, as mentioned, does not provide the advantages of welding. As discussed hereinbefore, to provide welding with conventional glass feedthroughs would increase the overall height to an unacceptable 160 mils.

BRIEF DESCRIPTION OF THE DRAWINGS

These and other features of the subject invention will be better understood in connection with the detailed description taken in conjunction with the drawings of which.

DETAILED DESCRIPTION

Figure 1:
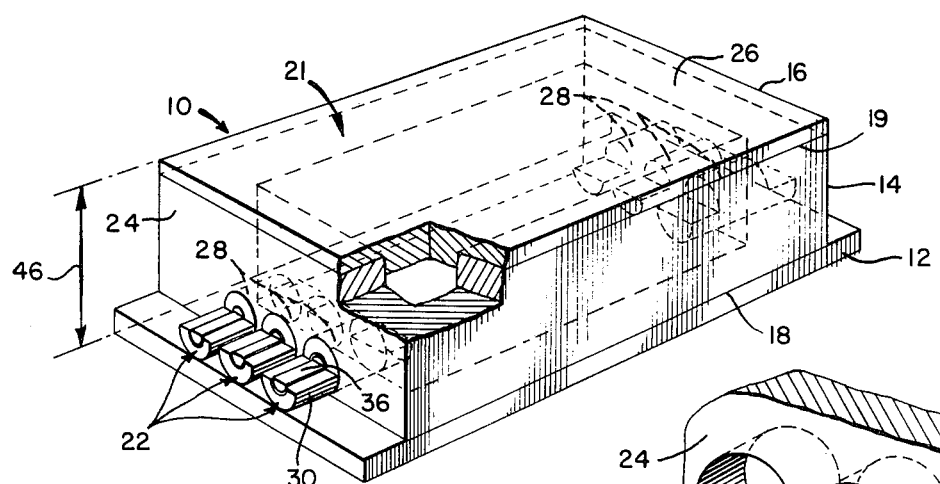
FIG. 1 is a perspective view of an all-metal microwave chip carrier which welded cover and subminiature ceramic coaxial cable-type feedthroughs.

Referring now FIG. 1, an all-metal microwave chip carrier 10 is illustrated as including a metal base 12, an intermediate ring 14, and a lid 16. In a preferred embodiment, the components of the microwave chip carrier are made of Kovar or other suitable material, although base 12 may be made of molybdenum should better heat sink qualities be desired. In the manufacture of the chip carrier, hermetic sealing is provided by brazing or soldering base 12 to ring 14 at line 18, whereas lid 16 is welded to ring 14 along weld line 19. In one embodiment, the lid is a stepped lid in the sense that an interior rectangular projection 20 is adapted to fit in cavity 21 when the lid is in place.

Figure 2:
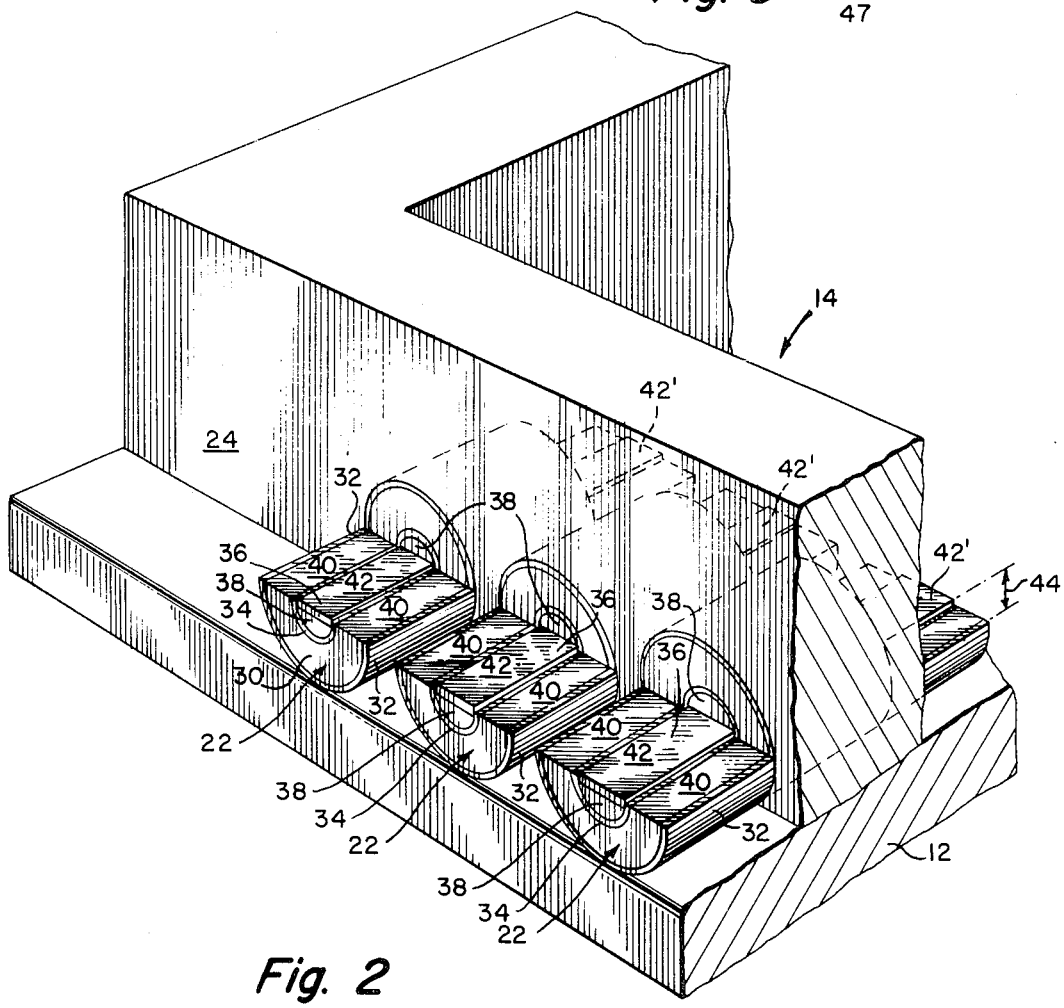
FIG. 2 is a diagrammatic and cross-sectional illustration of a portion of the chip carrier of FIG. 1.

Electrical feedthroughs 22 are subminiature and pass through opposing walls 24 and 26 of ring 14. Each feedthrough has a coaxial cable-like section 28 which passes through the corresponding ring wall. In one embodiment, each of the feedthroughs includes a ceramic tube 30, which is metallized interiorally and exteriorally as illustrated in FIG. 2 by metallization layers 32 and 34, with metallization layer 32 being deposited on the exterior surface of the tube, and metallization layer 34 being deposited on the interior central channel of the tube.

Each of feedthroughs 22 is provided with a flat wire or lead 36 running through the central metallized channel in tube 30, with flat lead 36 being soldered in place as illustrated at 38, such that with respect to the part of the feedthrough passing through wall 24, the flat wire and associated solder correspond to a cylindrical central conductor of a typical coaxial cable.

The portions of the feedthrough tubes extending to either side of wall 24 are cut back to provide flat steps generally indicated at 40, which are adapted to provide lateral flat portions adjacent exposed portions 42 of the flat wires. Portions 42 therefore provide both internal and external contact pads. With respect to the interior pads 42', with a total diameter of 50 mils, the pads sit only 25 mils above the top surface of base 12, as illustrated by double-ended arrow 44. This provides a relatively low seating plane within the carrier ring, such that microwave components can be mounted well within cavity 21.

The dimensions of the subminiature feedthrough can be tailored such that the impedance of the feedthrough is 50 ohms, which matches the conventional coaxial cable impedance. Thus standing wave ratios associated with the chip carrier can be reduced. In one embodiment, the tubing for the subminiature feedthroughs has an outside diameter of approximately 50 mils with a centrally located cylindrical interior channel of 13 mils. The ceramic in the preferred embodiment is 98 percent alumina, such that the impedance of the feedthrough can be made to be 50 ohms.

With such small subminiature feedthroughs, the overall package height illustrated by double-ended arrow 46 of FIG. 1 can be kept to 115 mils, assuming a 20-mil base and a 5-mil lid.

Because the chip carrier is not metallized, and is rather hermetically sealed by welding, a stepped lid may be provided for field use such that a carrier having feedthroughs, a ring, and a base is provided into which microwave device is mounted in the field. Thereafter the lid is welded to the ring in a simple operation. Since at least the lid and ring are of compatible material with respect to the welding, welding in the field present few of the difficulties associated with brazing or soldering when prior art metallized microwave chip carriers are provided.

Figure 3:
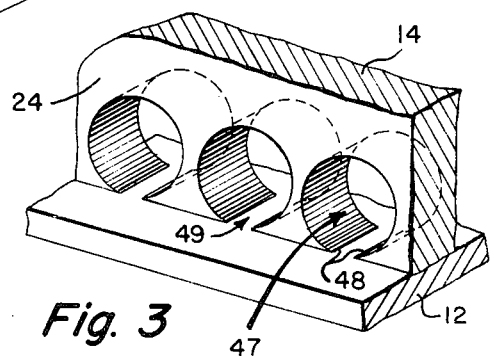
FIG. 3 is a diagrammatic illustration of a portion of the chip carrier of FIG. 1 illustrating feedthrough-receiving bores opened at the bottom of the wall of a ring.

Referring now to FIG. 3, bores 47 are cut into the base of ring 14 in such a manner as to expose the bore along a slot denoted by edges 48. Each of the bores accommodates a feedthrough such that, when mounted, the exterior surface of the feedthrough is in mechanical contact with the top surface of the base at 49. Brazing, soldering, or welding the base to the ring provides that intimate electrical contact is made to the externally metallized feedthrough. Thus base 12 functions as an exceptionally good groundplane for the microwave components mounted in the carrier.

Figure 4A:
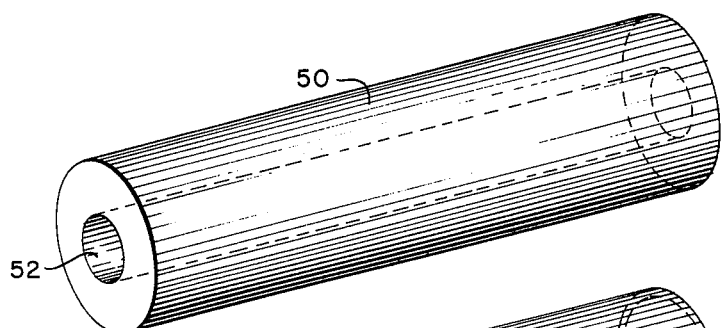
FIGS. 4A–4D are illustrations of a technique for fabricating the subminiature feedthroughs of FIGS. 1 and 2.
Figure 4B:
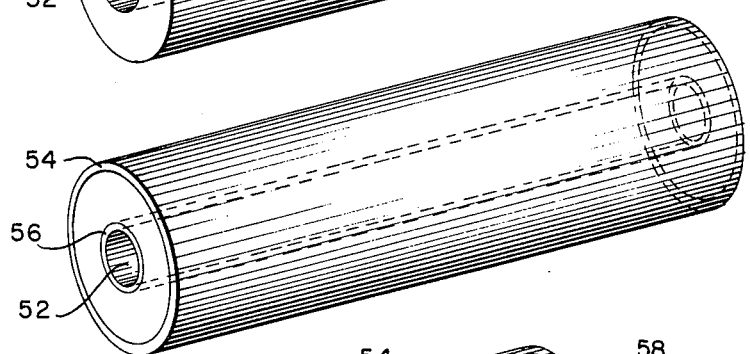

Referring now to FIGS. 4A–4D, one method of manufacturing the subminiature feedthroughs is illustrated. In this method, a ceramic tube 50 is provided in which the tube has a central bore 52. Metallization layers 54 and 56 are provided on exterior and interior surfaces of the tube as illustrated in FIG. 4B. Metallization may be tungsten or indeed any suitable metallization layer. The thickness of these metallization layers in a preferred embodiment is 300 to 500 microinches.

Figure 4C:
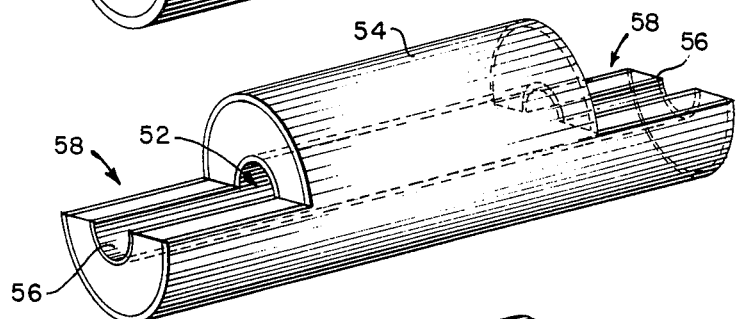
Figure 4D:
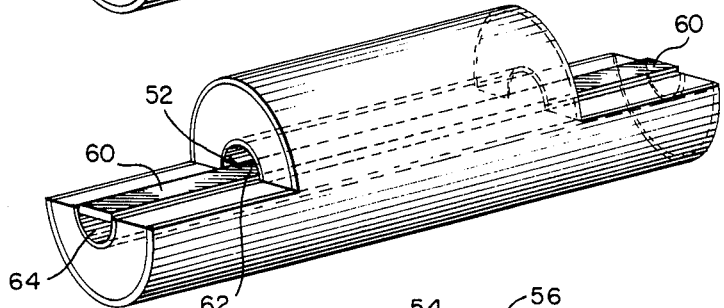
Figure 5:
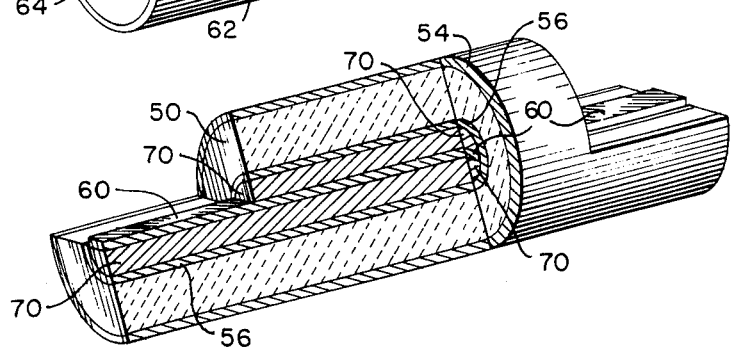
FIG. 5 is a partial cross-sectional and perspective view of a feedthrough manufactured in accordance with the techniques of FIGS. 4A–4D.

Referring now to FIG. 4C, stepped portions 58 are provided by cutting away half-cylindrical end portions of the composite tube provided after the FIG. 4B step. Thereafter, as illustrated in FIG. 4D, a flat wire lead 60 is passed through channel 52 and is suspended centrally because the width of the wire matches the interior diameter of channel 52 carrying metallization layer 56. Portions 62 and 64 of channel 52 existing above and below wire 60 are filled with solder or other electrically conductive material such that a central conductor is formed in this section of the feedthrough, thereby providing that this section resembles and functions as a coaxial cable with a cylindrical center conductor and a cylindrical outer conductor. The finished product shown in partial cross-section is illustrated in FIG. 5, in which like elements with respect to FIGS. 4 and 5 are provided with like reference characters. Here the coaxial-cable nature of the feedthrough can be plainly seen in which wire 60, solder 70, and layer 56, all being of electrically conductive material, form the inner coaxial cable conductor. The outer coaxial cable conductor, as mentioned above, is provided by layer 54.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. Apparatus for housing a microwave device comprising:
    an all-metal housing including a base, an intermediate ring mounted to said base and in electrical contact therewith, and a lid adapted to be electrically and hermetically sealed to said ring, said ring having a side wall having a bore therethrough, and
    a subminiature feedthrough inserted in said bore, said feedthrough having a coaxial configuration including a ceramic tube having an interior and exterior metal coating, and an inner conductor positioned through said tube along the longitudinal axis thereof and being in electrical contact with the interior metal coating of said tube, said tube including an at least partially cut-away portion to one side of said sidewall to expose a portion of said conductor.

2. The apparatus of claim 1 wherein said ring and lid are made of a material which permits welding said lid to said ring.

3. The apparatus of claim 2 wherein said lid and ring are an iron-nickel-cobalt alloy.

4. The apparatus of claim 1 wherein said conductor includes a flat wire, and wherein said cut-away portion is flat and lies in a plane parallel to the width of said flat wire, thereby to provide a contact pad.

5. The apparatus of claim 4 wherein said cut-away portion is half-cylndrical.

6. The apparatus of claim 4 wherein the space between said flat wire and said interior metallization is filled with electrically conductive material.

7. The apparatus of claim 6 wherein said electrically conductive material is solder.

8. The apparatus of claim 1 wherein said bore is open at the bottom thereof and wherein the exterior coating of said tube is in intimate contact with said base through the open bottom of said bore.

9. The apparatus of claim 1 wherein said feedthrough is no more than 50 mils in diameter.

10. A subminiature feedthrough for use in the packaging of microwave components comprising:
    a length of dielectric tubing metallization interiorially and exteriorially, an end of said tubing being cut away to provide a flat portion at an end of the tube adjacent the tube channel, and
    a flat wire in said channel and extending to the vicinity of said flat portion such that the wide portion of said wire lies in a plane parallel to that of said flat portion, thereby to provide an accessible contact pad at an end of said tubing.

11. The feedthrough of claim 10 wherein the dimensions and dielectric constant of said tube are chosen to provide the resulting coaxial structure with a predetermined electrical impedance.

12. The feedthrough of claim 10 wherein the edges of said flat wire contact the interior metallization of said tubing.

13. The feedthrough of claim 10 wherein said tubing is made of ceramic material.

14. The feedthrough of claim 10 wherein said tubing is made from glass.

15. The feedthrough of claim 10 wherein the outer diameter thereof is less than 50 mils.

16. The feedthrough of claim 10 wherein the space between said flat wire and said interior metallization is filled with electrically conductive material.

17. The feedthrough of claim 16 wherein said electrically conductive material is solder.

18. A method of forming a subminiature electrical feedthrough having a coaxial structure comprising the steps of:
    metallizing an electrically nonconductive tube on the interior and exterior walls thereof;
    cutting away at least one end portion of the metallized tube to provide a half-cylindrical portion; and
    passing a wire through the interior channel of the metallized tube, such that the wire makes electrical contact with the interior metallized wall of the tube and such that a portion of the wire extends to the half-cylindrical portion.

19. The method of claim 18 wherein said wire is flat.

20. The method of claim 18 wherein said wire is soldered to said interior metallized wall.

* * * * *